(12) United States Patent
Heim et al.

(10) Patent No.: US 9,901,011 B2
(45) Date of Patent: Feb. 20, 2018

(54) COOLING SYSTEMS FOR DEVICES ARRANGED IN ROWS

(71) Applicants: Frank Heim, Platteville, WI (US);
Kevin J. Gebke, Dubuque, IA (US);
Micaela White, Chicago, IL (US);
Nicholas L. Kaufmann, Sherrill, IA (US)

(72) Inventors: Frank Heim, Platteville, WI (US);
Kevin J. Gebke, Dubuque, IA (US);
Micaela White, Chicago, IL (US);
Nicholas L. Kaufmann, Sherrill, IA (US)

(73) Assignee: RITE-HITE HOLDING CORPORATION, Milwaukee, WI (US)

( * ) Notice: Subject to any disclaimer, the term of this patent is extended or adjusted under 35 U.S.C. 154(b) by 113 days.

(21) Appl. No.: 14/932,676

(22) Filed: Nov. 4, 2015

(65) Prior Publication Data

US 2017/0127574 A1    May 4, 2017

(51) Int. Cl.
*H05K 7/20* (2006.01)

(52) U.S. Cl.
CPC ..... *H05K 7/20745* (2013.01); *H05K 7/20145* (2013.01)

(58) Field of Classification Search
None
See application file for complete search history.

(56) References Cited

U.S. PATENT DOCUMENTS

| 2,013,724 A | 9/1935 | Brady |
| 3,699,872 A | 10/1972 | Kruger |

(Continued)

FOREIGN PATENT DOCUMENTS

| DE | 1956659 | 6/1970 |
| DE | 20010135 | 9/2000 |

(Continued)

OTHER PUBLICATIONS

International Searching Authority, "International Search Report and Written Opinion," issued in connection with PCT Application No. PCT/US2016/059843, dated Feb. 6, 2017, 15 pages.

(Continued)

*Primary Examiner* — Dimary Lopez Cruz
*Assistant Examiner* — Zhengfu Feng
(74) *Attorney, Agent, or Firm* — Hanley, Flight & Zimmerman, LLC

(57) ABSTRACT

An example cooling system for a datacenter is disclosed. The datacenter includes a plurality of computers arranged in a row within a building. The row of computers separates a cold aisle and a hot aisle. The row of computers defines an air passageway between the cold aisle and the hot aisle. The row of computers is associated with a top surface that is below and spaced apart from an overhead surface of the building to define a gap between the top surface and the overhead surface. The example cooling system includes an inflatable air duct to be disposed within the gap. The inflatable air duct has selectively an inflated state and a deflated state. The inflatable air duct filling more of the gap when the inflatable air duct is in the inflated state than when the inflatable air duct is in the deflated state.

19 Claims, 13 Drawing Sheets

(56) References Cited

U.S. PATENT DOCUMENTS

| | | |
|---|---|---|
| 3,726,203 A | 4/1973 | Lindestrom |
| 3,824,909 A | 7/1974 | Horneff et al. |
| 4,890,544 A | 1/1990 | Aalto et al. |
| 5,044,259 A | 9/1991 | Catan et al. |
| 5,094,273 A | 3/1992 | Eagleton |
| 5,111,739 A | 5/1992 | Hall |
| 5,137,057 A | 8/1992 | Hummert, III |
| 5,285,818 A | 2/1994 | Hummert, III |
| 5,490,813 A | 2/1996 | Danielsen et al. |
| 6,113,486 A | 9/2000 | Beudon et al. |
| 6,558,250 B1 | 5/2003 | Paschke |
| 6,565,430 B2 | 5/2003 | Gebke |
| 6,953,396 B2 | 10/2005 | Paschke et al. |
| 6,960,130 B2 | 11/2005 | Gebke et al. |
| 9,103,117 B1 | 8/2015 | Lundskog et al. |
| 9,152,191 B1 | 10/2015 | Gardner |
| 9,485,887 B1* | 11/2016 | Eichelberg ............ H05K 7/1497 |
| 2003/0022617 A1* | 1/2003 | Gebke .................. B01D 46/008 |
| | | 454/306 |
| 2004/0198215 A1 | 10/2004 | Bridenne et al. |
| 2004/0229559 A1 | 11/2004 | Gebke et al. |
| 2005/0250436 A1 | 11/2005 | Nilsson |
| 2006/0252365 A1 | 11/2006 | Gebke |
| 2007/0281639 A1* | 12/2007 | Clidaras ................... G06F 1/20 |
| | | 455/128 |
| 2008/0158818 A1* | 7/2008 | Clidaras ................. G06F 1/206 |
| | | 361/699 |
| 2008/0176506 A1 | 7/2008 | Gebke et al. |
| 2009/0046427 A1* | 2/2009 | Noteboom ......... H05K 7/20745 |
| | | 361/695 |
| 2009/0173017 A1 | 7/2009 | Hall |
| 2009/0210096 A1* | 8/2009 | Stack .................... F24F 11/0009 |
| | | 700/278 |
| 2010/0048121 A1 | 2/2010 | Klopfenstein et al. |
| 2011/0269390 A1* | 11/2011 | Pinkalla .................. F16L 11/02 |
| | | 454/284 |
| 2012/0006442 A1 | 1/2012 | Gebke et al. |
| 2013/0255973 A1 | 10/2013 | Prieur |
| 2014/0254090 A1* | 9/2014 | Gardner ............ H05K 7/20745 |
| | | 361/679.49 |
| 2016/0029513 A1 | 1/2016 | Gardner |

FOREIGN PATENT DOCUMENTS

| | | |
|---|---|---|
| EP | 0856709 | 8/1998 |
| GB | 1589196 | 5/1981 |
| GB | 2120778 | 12/1983 |
| WO | 2006119399 | 11/2006 |
| WO | 2010095931 | 8/2010 |

OTHER PUBLICATIONS

International Searching Authority, "International Search Report and Written Opinion," issued in connection with International Patent Application No. PCT/US2017/050092, dated Nov. 21, 2017, 17 pages.

* cited by examiner

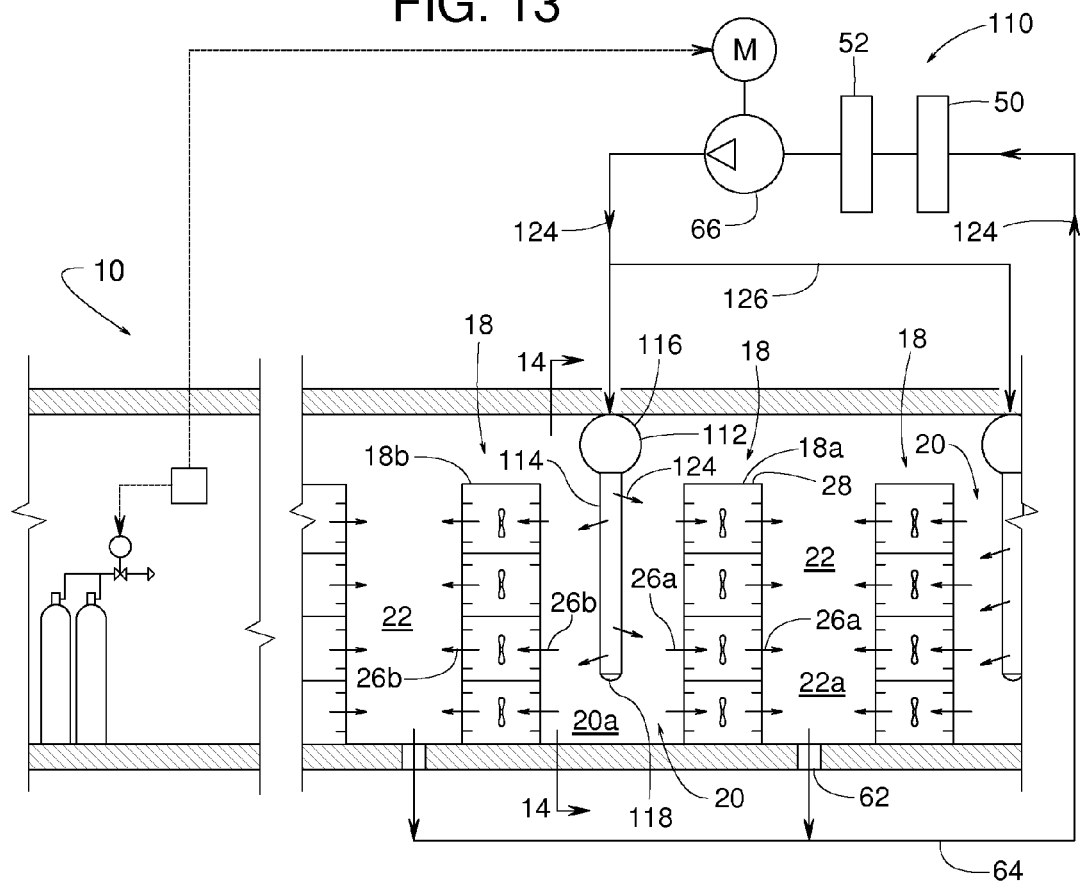
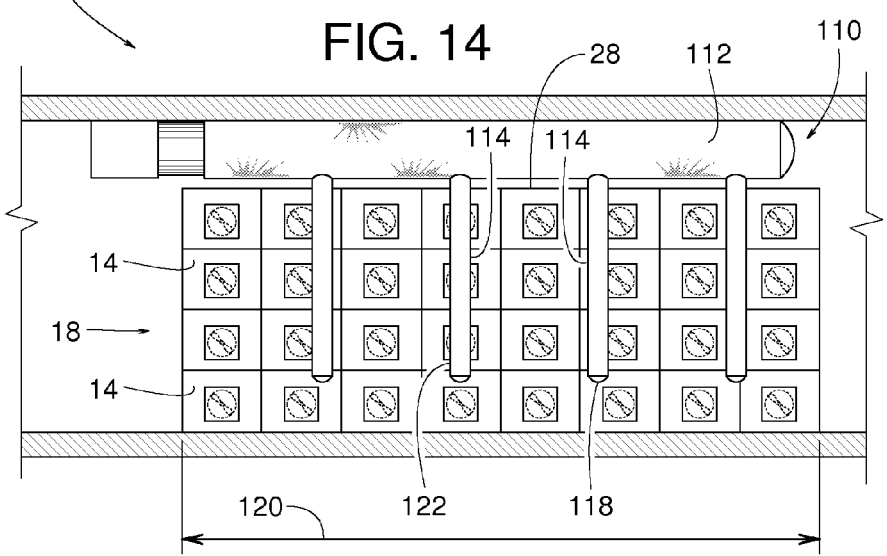

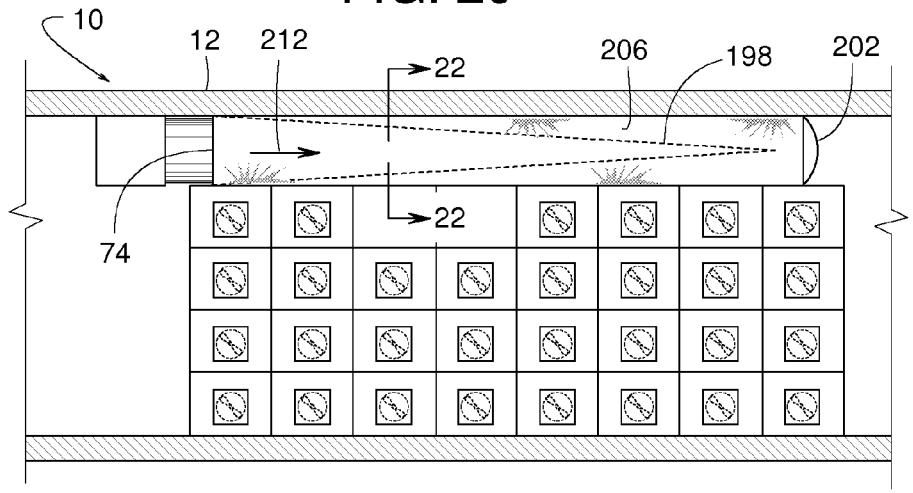
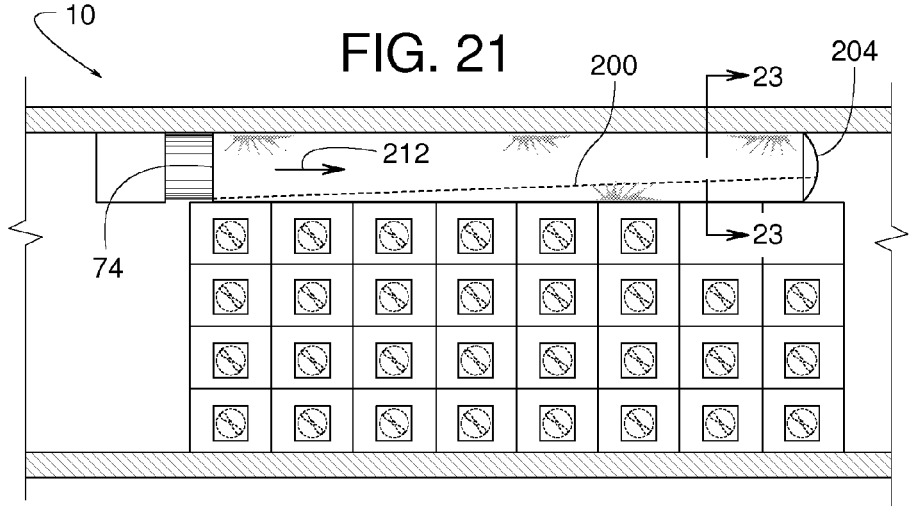
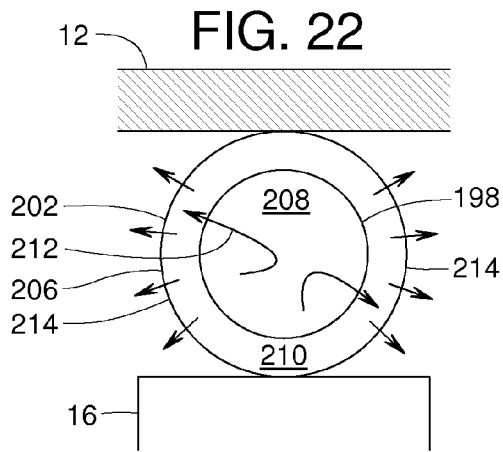
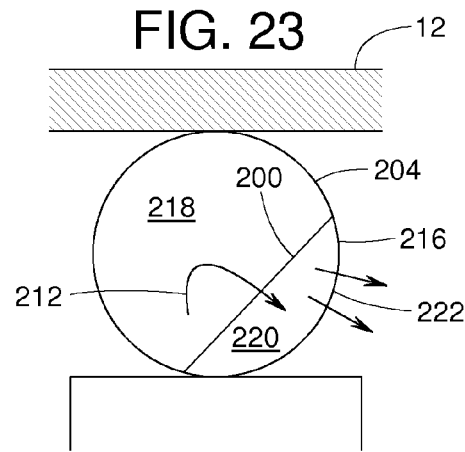

COOLING SYSTEMS FOR DEVICES ARRANGED IN ROWS

FIELD OF THE DISCLOSURE

This patent generally pertains to cooling systems and more specifically to cooling systems for devices arranged in rows.

BACKGROUND

Server-based datacenters, sometimes known as server farms or server clusters, are a large collection of computers, often at a physically remote but network accessible location, that provide clients with expanded computing capability. The expanded computing capability typically is in the form of data storage, data processing, database management, file management, and website management.

Each computer of the system usually includes a base or case supporting a set of computer components. Depending on the application, computer components may include items such as one or more microprocessors, hard drives, solid state memory devices, routers and power supplies. More generally, there are many types of electronic equipment and/or other devices that may emit heat to the surrounding area during operation. To maintain such components at a safe operating temperature, the base or case of each computer or other heat generating device usually includes or is otherwise associated with a cooling fan that forces a current of environmentally controlled air from a front face of the computer or other device, across the components, and out through a back end of the computer or other device. In some cases, it is this current of air that defines the front and back ends of the computer or other device.

Somewhat resembling books in an open bookshelf, computers at a datacenter may be stacked in rack-like cabinets that are neatly arranged in rows separated by aisles. The aisles provide manual access to the front and back ends of the computers. The rows of computers are oriented such that each individual aisle is exposed solely to computer fronts or solely to computer backs. Thus, the front ends of computers in one row face the front ends of computers in the next row across the aisle. In the very next aisle, the back ends of computers on opposite sides of that aisle face each other. Aisles of computer fronts are generally cooler than backside aisles due to the computer components heating the current of air developed by the computers' internal cooling fans. Thus, front side cooler aisles are often called "cold aisles," and back side aisles are known as "hot aisles." Each aisle being exposed to only computer fronts or to only computer backs creates an alternating arrangement of cold aisles and hot aisles. Similar arrangements of other types of electronic equipment or other devices that generate heat may be implemented to cool such devices during operation.

Datacenters usually run nonstop and generate a lot of heat. Consequently, a building air conditioning system is usually needed to prevent the computers from overheating. In the event of a fire, a generally inert gas system or some other type of fire suppression system automatically activates to prevent or reduce (e.g., minimize) damage.

BRIEF DESCRIPTION OF THE DRAWINGS

FIG. 13 is a cross-sectional view similar to FIG. 3 but showing another example cooling system constructed in accordance with the teachings disclosed herein.

FIG. 14 is a cross-sectional view taken along line 14-14 of FIG. 13.

FIG. 20 is a cross-sectional view similar to FIG. 19 but showing another example cooling system constructed in accordance with the teachings disclosed herein.

FIG. 21 is a cross-sectional view similar to FIGS. 19 and 20 but showing another example cooling system constructed in accordance with the teachings disclosed herein.

FIG. 22 is a cross-sectional view taken along line 22-22 of FIG. 20.

FIG. 23 is a cross-sectional view taken along line 23-23 of FIG. 21.

DETAILED DESCRIPTION

Example cooling systems for server-based datacenters, or server farms, include air permeable inflatable air ducts installed above multiple rows of computer racks. In some examples, in the event of a fire, the air ducts deflate and collapse so as not to obstruct the flow of a fire extinguishing gas. In some examples, when inflated, the air ducts have an expanded shape that inhibits adverse mixing of air between hot aisles and cold aisles. In some examples, wings extend laterally from the air duct to further reduce the mixing of hot and cold air. In some examples, a series of inflatable branch ducts extend downward from a supply air duct to reach well into cold aisles. In some examples, nozzles and/or internal baffles promote radial air discharge from the supply air duct.

Figure 1:
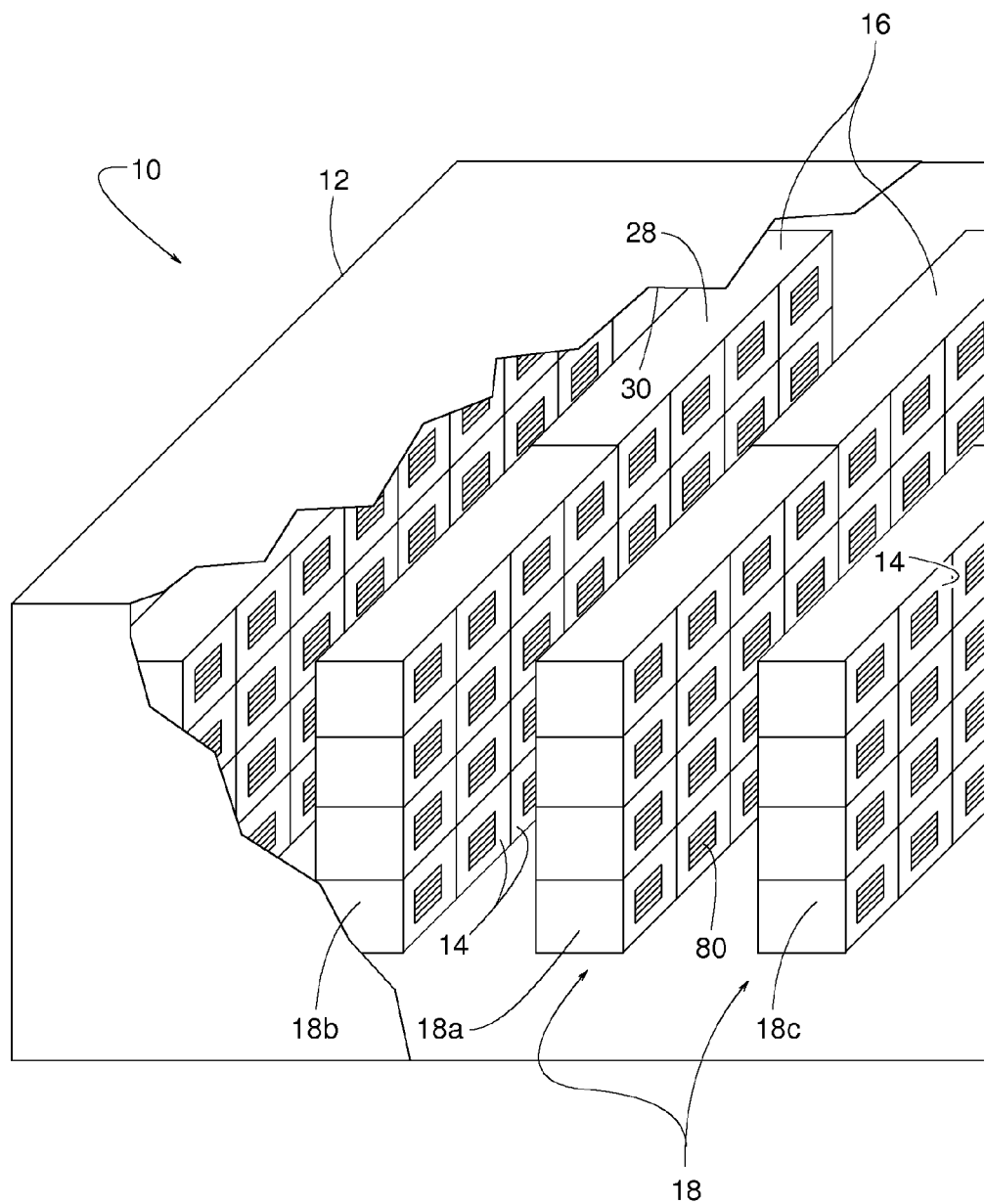
FIG. 1 is a cutaway perspective view of an example datacenter or server farm constructed in accordance with the teachings disclosed herein.
Figure 2:
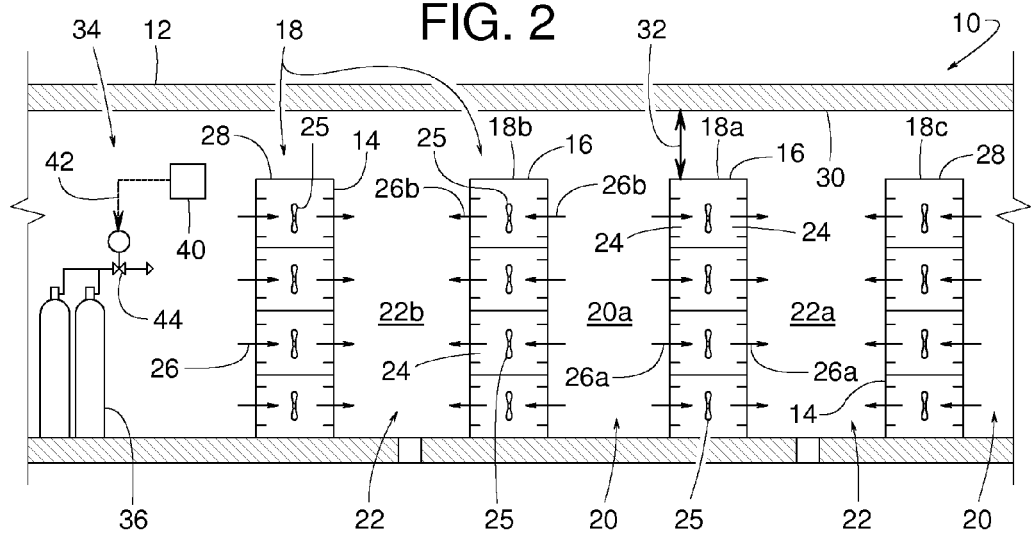
FIG. 2 is a cross-sectional end view of the example datacenter shown in FIG. 1.

FIGS. 1 and 2 show an example datacenter 10 including a building 12 containing a plurality of computers 14 in a plurality of cabinets 16. The term, "computer" refers to any digital processing device, examples of which include a server, a data storage device, a hard drive, a solid state memory, etc. The term, "cabinet" refers to any structure for supporting and/or housing one or more of the plurality of computers 14. Examples of a cabinet include a plurality of enclosures supporting and/or housing at least one computer, a single enclosure containing a single computer, a single enclosure housing a plurality of computers, a rack, a shelf, etc. In examples where a plurality of computers are housed or supported by or within one or more cabinets, the term, "row of computers" encompasses the associated cabinets (i.e., the racks, shelving, and/or other enclosure or support for the computers). So, in some examples, the terms, "row of computers" and "row of cabinets" can be used interchangeably. Although the teachings of this disclosure are described with respect to rows of computers, the teachings of this disclosure may apply to any other type of electronic equipment or devices that are to be cooled through forced air when arranged in one or more rows.

In the illustrated example, the cabinets 16 are arranged in a plurality of rows 18 to create a first row of computers 18a (a first row of cabinets) and a second row of computers 18b (a second row of cabinets). The plurality of rows of computers 18 also creates an alternating arrangement of a plurality of cold aisles 20 (e.g., a first aisle 20a) and a plurality of hot aisles 22 (e.g., a second aisle 22a and a third aisle 22b). In some examples, there may be only a single hot aisle and a single cold aisle. As used herein, the term "aisle" refers to the space between adjacent rows of computers 18 as well as the space adjacent the outer side of an outer row of the plurality of rows 18. Thus, in some examples, there may be only a single row of computers 18 that defines hot and cold aisles on either side without adjacent rows on either side of the single row of computers 18. The terms, "hot" and "cold" in reference to an aisle merely means that the average air temperature of the hot aisle is greater than that of the cold aisle. The terms, "hot aisle" and "cold aisle" do not suggest that either aisle is at any particular absolute temperature. At least one computer 14 and/or at least one row of cabinets 16 define an air passageway 24 between a cold aisle 20a and one or more hot aisles 22a, 22b. One or more internal fans 25 within the air passageway 24 creates a current of air 26 (e.g., a first current of air 26a from the cold aisle 20a (the first aisle) to the first hot aisle 22a (the second aisle) and/or a second current of air 26b from the cold aisle 20a to the second hot aisle 22b (the third aisle)) for cooling the internal components of the computers 14. The cabinets 16 have a top surface 28 that is below and spaced apart from an overhead surface 30 of the building 12 to create a gap 32 between the top surface 28 and the overhead surface 30.

In the illustrated example, the datacenter 10 also includes a fire suppression system 34. In some examples, the fire suppression system 34 includes one or more pressurized tanks 36 of a fire extinguishing fluid 38 (FIG. 4) such as halon, halocarbons, carbon dioxide or an inert gas. In the event of a fire-related incident (e.g., fire, heat, smoke, manually triggered fire alarm, etc.), a sensor 40 detects and responds to the incident by sending a signal 42 that opens a valve 44, which releases the fire extinguishing fluid 38 from the tanks 36 to displace the oxygen surrounding the rows of computers 18.

Figure 3:
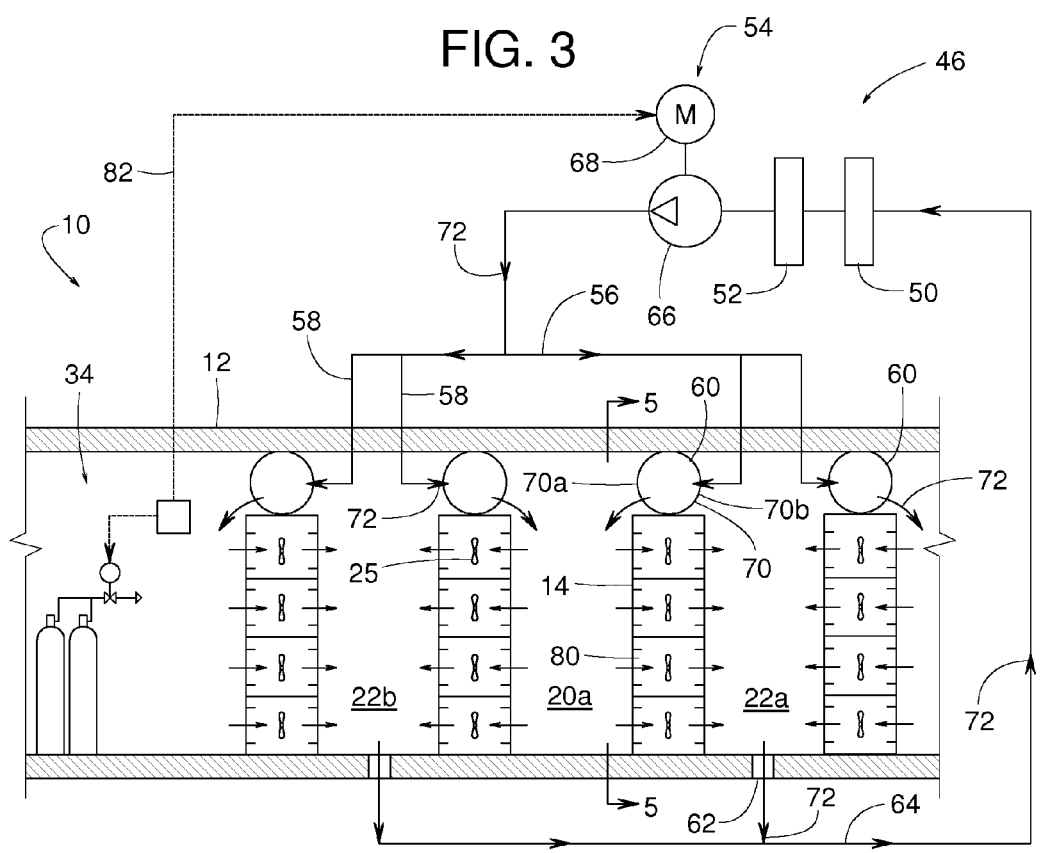
FIG. 3 is cross-sectional end view similar to FIG. 2 but showing an example cooling system of the example datacenter constructed in accordance with the teachings disclosed herein, wherein portions of the example cooling system are schematically illustrated.
Figure 4:
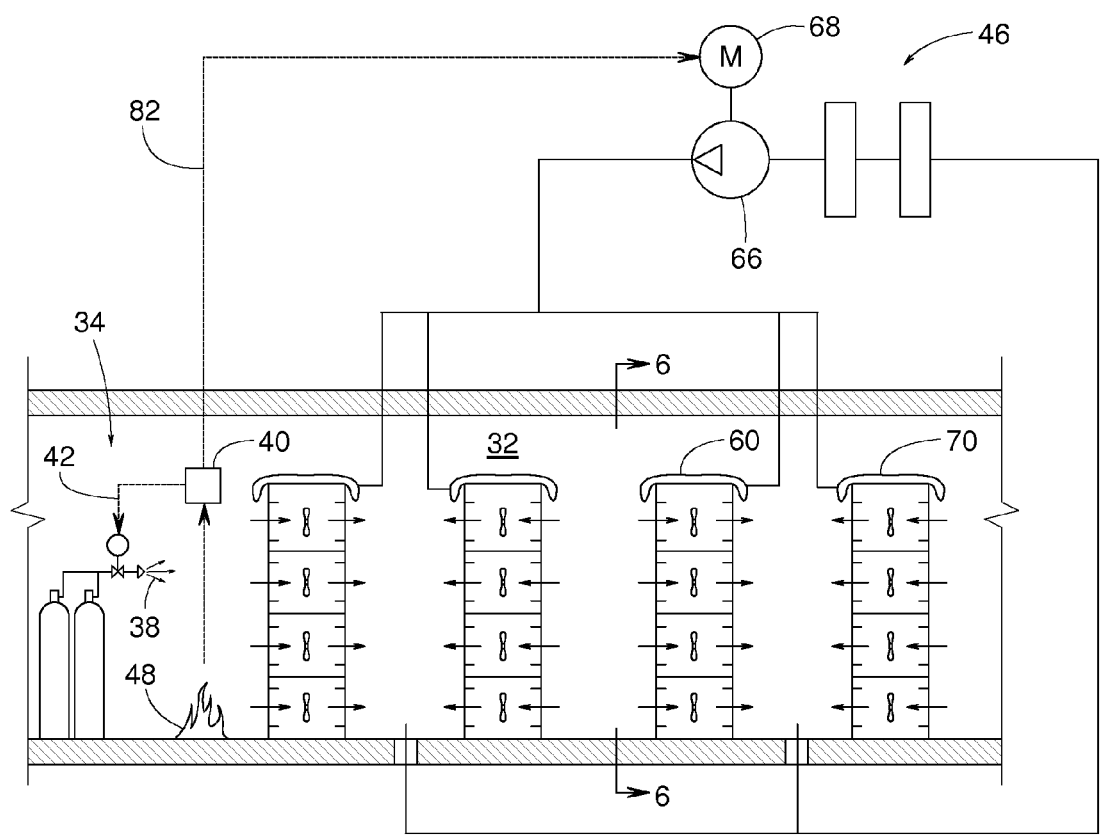
FIG. 4 is cross-sectional end view similar to FIG. 3 but showing example air ducts of the example cooling system in a deflated state as opposed to the inflated state shown in FIG. 3.

FIG. 3-6 show the addition of an example cooling system 46 for efficiently extracting heat generated by the computers 14 during normal operation without interfering with the fire suppression system 34 during a fire 48 (FIG. 4). In this example, the cooling system 46 includes an air filter 50, a known cooling coil 52 (e.g., a water, glycol, or refrigerant cooled heat exchanger), a blower system 54, a supply air manifold 56, at least one branch air duct 58, at least one supply air duct 60, at least one return air register 62, and a return air manifold 64. The term, "blower system" refers to one or more blowers 66 powered by at least one motor 68. The supply air duct 60 is inflatable by virtue of its tubular wall 70 (e.g., 70a and 70b) being made of a pliable material (e.g. air permeable sheet, air impermeable sheet, nonmetallic sheet, coated fabric, uncoated fabric, and various combinations thereof). The term, "pliable" refers to a material that can be crumpled and later straightened without appreciable damage to the material. The term, "inflatable" as it relates to an air duct means that the duct's internal volume expands with internal air pressure and tends to collapse when the pressure is removed.

Figure 5:
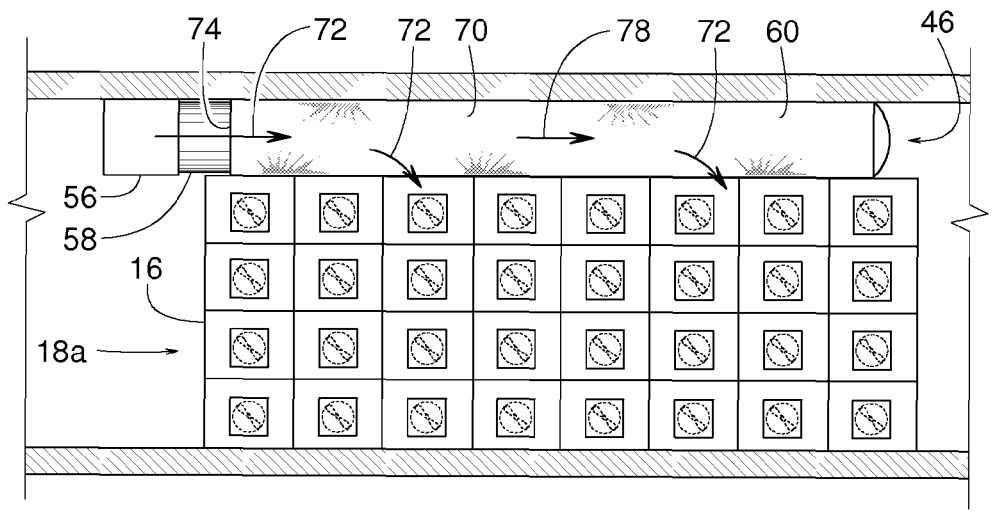
FIG. 5 is a cross-sectional view taken along line 5-5 of FIG. 3.

During normal operation, as shown in FIGS. 3 and 5, the blower 66 draws air 72 from the return air manifold 64, through the filter 50, and through the cooling coil 52. The blower 66 then discharges the filtered cool air through the supply air manifold 56, through the branch air ducts 58 and into an axial end 74 of each supply air duct 60. In the illustrated example, the discharge pressure of blower 66 inflates or fully expands each supply air duct 60. The supply air duct 60 in its expanded state, as shown in the examples of FIGS. 3 and 5, creates an obstruction that substantially fills or blocks gap 32 between the top surface 28 and the overhead surface 30. In some examples, the supply air duct 60 spans the entire gap 32 so as to be in contact with both the top surface 28 and the overhead surface 30 when inflated. The supply air duct 60 blocking the gap 32 reduces (e.g., minimizes) the mixing of cold and warm air between the cold aisle 20a and the hot aisle 22a.

Figure 18:
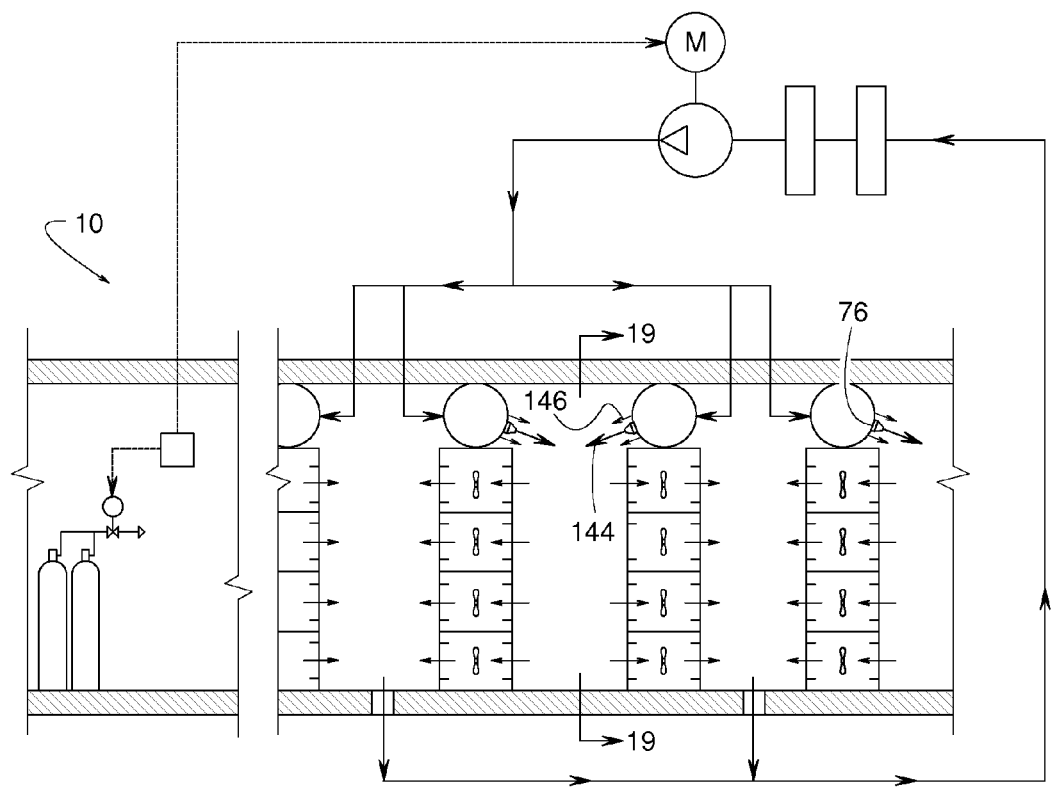
FIG. 18 is a cross-sectional view similar to FIG. 3 but showing another example cooling system constructed in accordance with the teachings disclosed herein.
Figure 19:
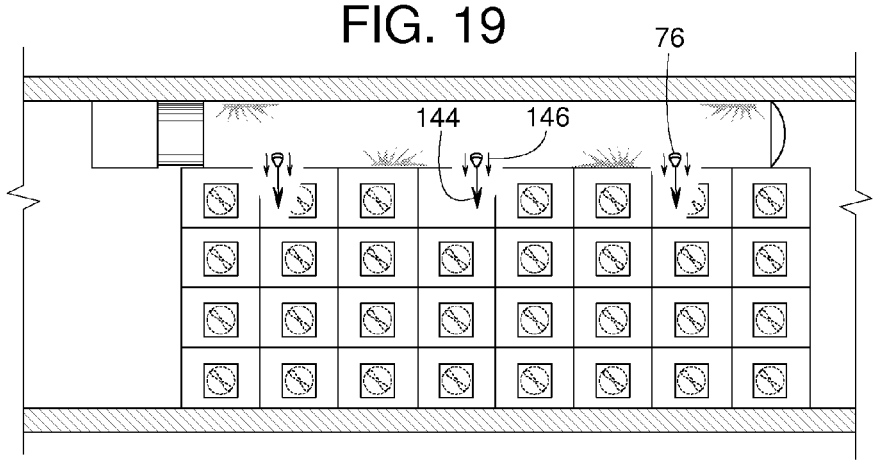
FIG. 19 is a cross-sectional view taken along line 19-19 of FIG. 18.

In this example, each supply air duct 60 has an air permeable sidewall 70a facing the cold aisle 20a and a substantially impermeable opposite sidewall 70b facing the hot aisle 22a. The sidewall 70a is made permeable by any suitable means, examples of which include porosity in the material of the tubular wall 70a, perforations in the tubular wall 70a, and/or the sidewall 70a having one or more nozzles 76 (FIGS. 18 and 19). In examples where only the sidewall 70a is air permeable, air discharged from the blower 66 flows lengthwise 78 (FIG. 5) through the supply air duct 60, radially outward through the sidewall 70a, and downward into the cold aisle 20a. From the cold aisle 20a, the cool air flows through the computers 14 via an air passageway 80 (through the computers 14 and/or through the cabinets 16), into the hot aisle 22a, and downward toward the return register 62. The register 62 conveys the air from the hot aisle 22a into the return manifold 64, which returns the air back to the filter 50 for recirculation.

Figure 6:
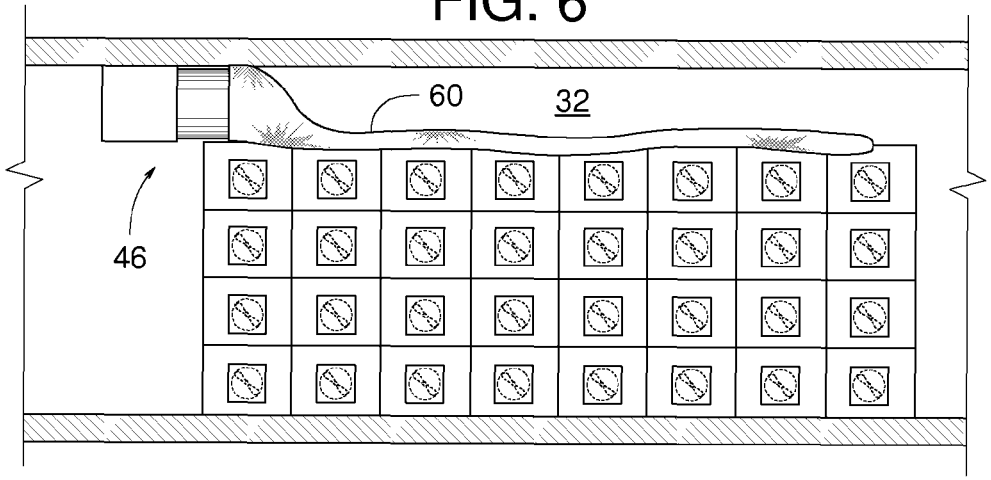
FIG. 6 is a cross-sectional view taken along line 6-6 of FIG. 4.

In some examples, in the event of a fire 48 or a fire-related incident (e.g., flame, smoke, heat, manually triggered fire alarm, etc.), the sensor 40 responds by sending the signal 42 to activate the fire suppression system 34, as described earlier, and also sends a signal 82 that de-energizes the motor 68 and, thus, stops the blower 66. Stopping the blower 66 depressurizes the supply air duct 60, which causes the supply air duct 60 to collapse to its deflated state, as shown in FIGS. 4 and 6. In the deflated state, the collapsed supply air duct 60 opens or substantially unblocks the gap 32 so that the fire extinguishing fluid 38 in a gaseous state can readily disperse over, around and through the multiple rows of computers 18.

Figure 7:
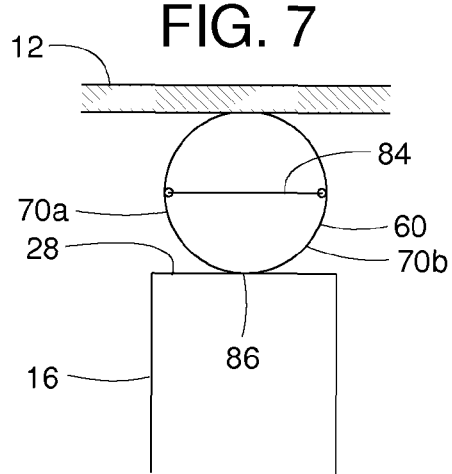
FIG. 7 is a cross-sectional end view of an example supply air duct constructed in accordance with the teachings disclosed herein.
Figure 8:
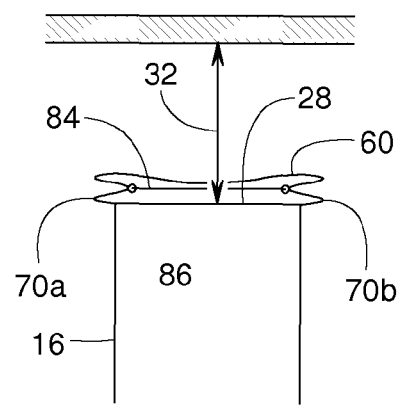
FIG. 8 is a cross-sectional end view similar to FIG. 7 but showing the example air duct in a deflated state as opposed to the inflated state shown in FIG. 7.

In some examples, the cooling system 46 includes means for preventing a collapsed supply air duct 60 from drooping excessively over the sides of the cabinets 16 and/or the computers 14. In the example shown in FIGS. 7 and 8, for instance, an internal restraint 84 (e.g., a string, a strap, a cable, a chain, a horizontal sheet, an elastic cord, a tie rod, etc.) limits the radially outward movement of the sidewalls 70*a* and 70*b* as the supply air ducts 60 deflate. FIG. 7 shows the supply air duct 60 in its inflated state, and FIG. 8 shows the supply air duct 60 in its deflated state. In some examples, a pair of taut internal or external restraints (e.g., cables) running parallel to the supply air duct 60 extend along the entire length of the sidewalls 70*a* and 70*b*. In some examples, the supply air duct 60 rests upon the top surface 28 such that the weight of the supply air duct is supported by the top surface 28. In some examples, the supply air duct 60 is secured to the top surface 28 to prevent the supply air duct 60 from sliding off the edge of the top surface 28 of the cabinets 16. In some examples, a bottom 86 of the supply air duct 60 rests upon a basket (not shown) rather than directly on the top surface 28 of the cabinets 16, wherein the basket is wider than the top surface 28 of the cabinets 16.

Figure 9:
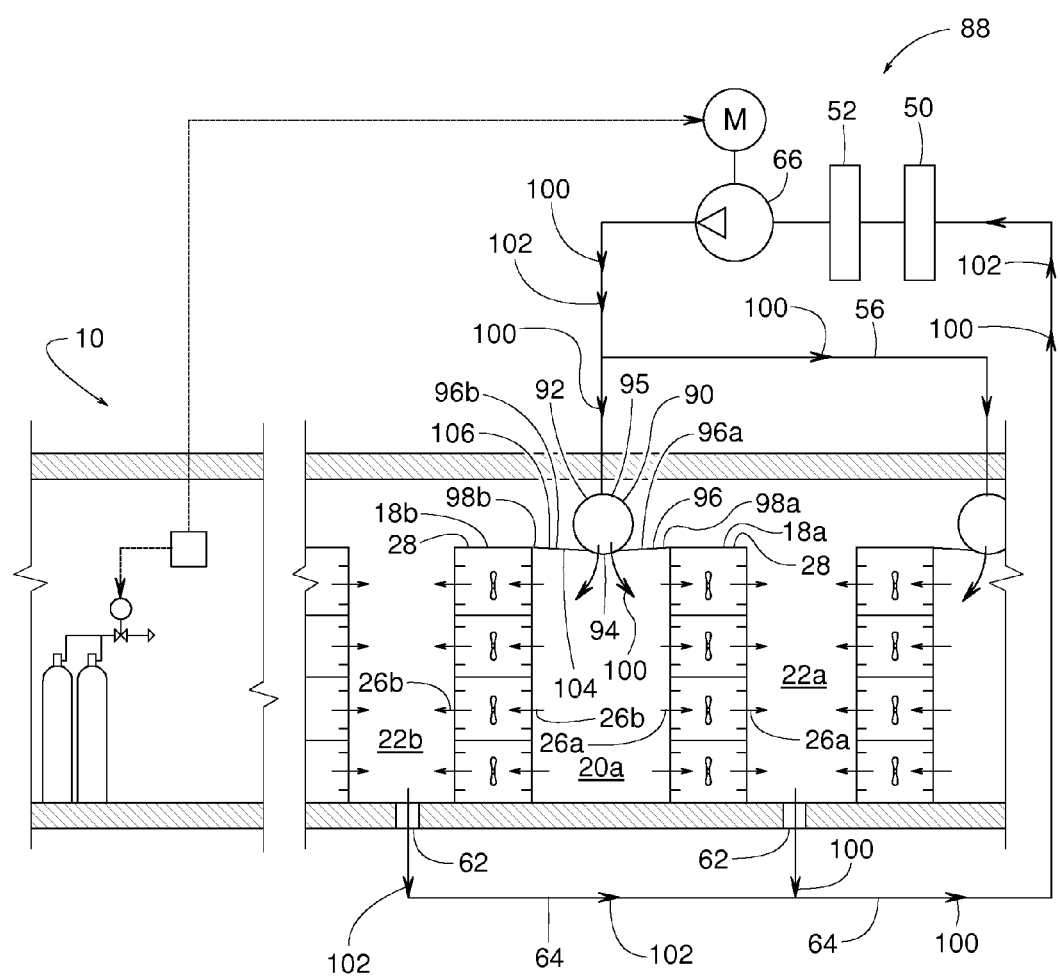
FIG. 9 is a cross-sectional view similar to FIG. 3 but showing another example cooling system constructed in accordance with the teachings disclosed herein.
Figure 10:
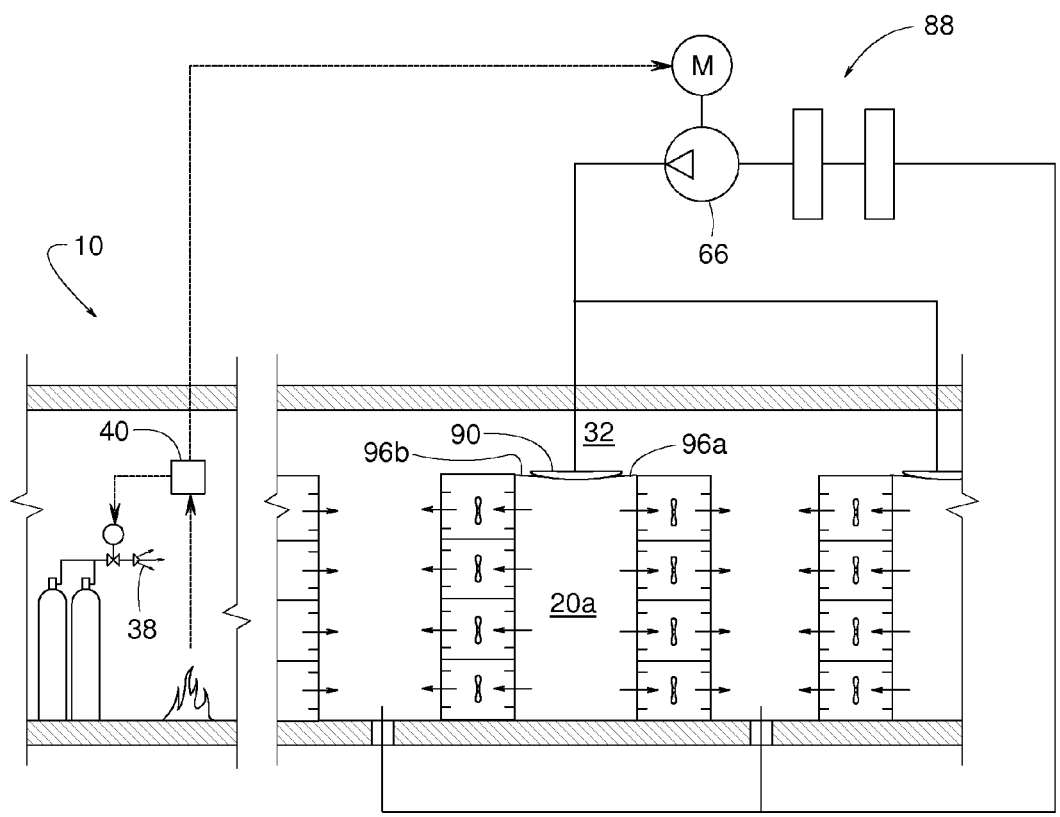
FIG. 10 is a cross-sectional view similar to FIG. 9 but showing the example air ducts in a deflated state as opposed to the inflated state shown in FIG. 9.

FIGS. 9 and 10 show an example cooling system 88 with a supply air duct 90 installed lengthwise (i.e., duct 90 is elongate in a direction parallel to the aisles) over the first cold aisle 20*a*, between the rows of computer 18*a* and 18*b*. In some examples, the supply air duct 90 has a pliable tubular wall 92 that renders the duct 90 inflatable, so the duct 90 has selectively an inflated state (FIG. 9) and a deflated state (FIG. 10). In the illustrated example, the supply air duct 90 has an air permeable lower section 94 for delivering cool supply air into the cold aisle 20*a*.

To prevent or reduce mixing of air between cold and hot aisles, the supply air duct 90 has an air impermeable upper section 95 and at least one wing 96 (e.g., a first wing 96*a* and a second wing 96*b*) extending from the supply air duct 90 toward an adjacent row of computers 18. In the illustrated example, the first wing 96*a* extends laterally from the supply air duct 90 to a first top surface 28 of the first row of computers 18*a* (and/or its associated cabinet 16), and the second wing 96*b* extends to a second top surface 28 of the second row of computers 18*b* (and/or its associated cabinet 16). In some examples, the wings 96 extend lengthwise substantially the full length of the rows of computer 18 and are made of a pliable sheet of material held taut by having distal edges 98*a*, 98*b* fastened to the cabinets 16 of the computer rows 18.

In some examples, the supply air duct 90 is installed at each cold aisle, so when the blower 66 is activated during normal operation, a first supply current of air 100 flows sequentially from the second aisle 22*a* (the first hot aisle), through the return register 62, through the return air manifold 64, through the filter 50, through the cooling coil 52, through the blower 66, through the supply air manifold 56, lengthwise through the first supply air duct 90, and downward from the first supply air duct 90 into the first aisle 20*a* (the cold aisle). Further, in the illustrated example, a second supply current of air 102 flows sequentially from the third aisle 22*b* (the second hot aisle), through the return register 62, through the return air manifold 64, through the filter 50, through the cooling coil 52, through the blower 66, through the supply air manifold 56, lengthwise through the supply air duct 90, and downward from the supply air duct 90 into the first aisle 20*a* (the cold aisle). The relatively cool air in the first aisle 20*a* supplies a first current of air 26*a* flowing through the first row of computers 18*a* to the second aisle 22*a* and further supplies a second current of air 26*b* flowing through the second row of computers 18*b* to the third aisle 22*b*.

In the event of a fire-related incident, the sensor 40 deactivates the blower 66 in some examples, which causes the supply air duct 90 to collapse to its deflated state, as shown in FIG. 10. In the deflated state, the collapsed supply air duct 90 opens or unblocks the gap 32 to facilitate the dispersion of the fire extinguishing fluid 38.

Figure 11:
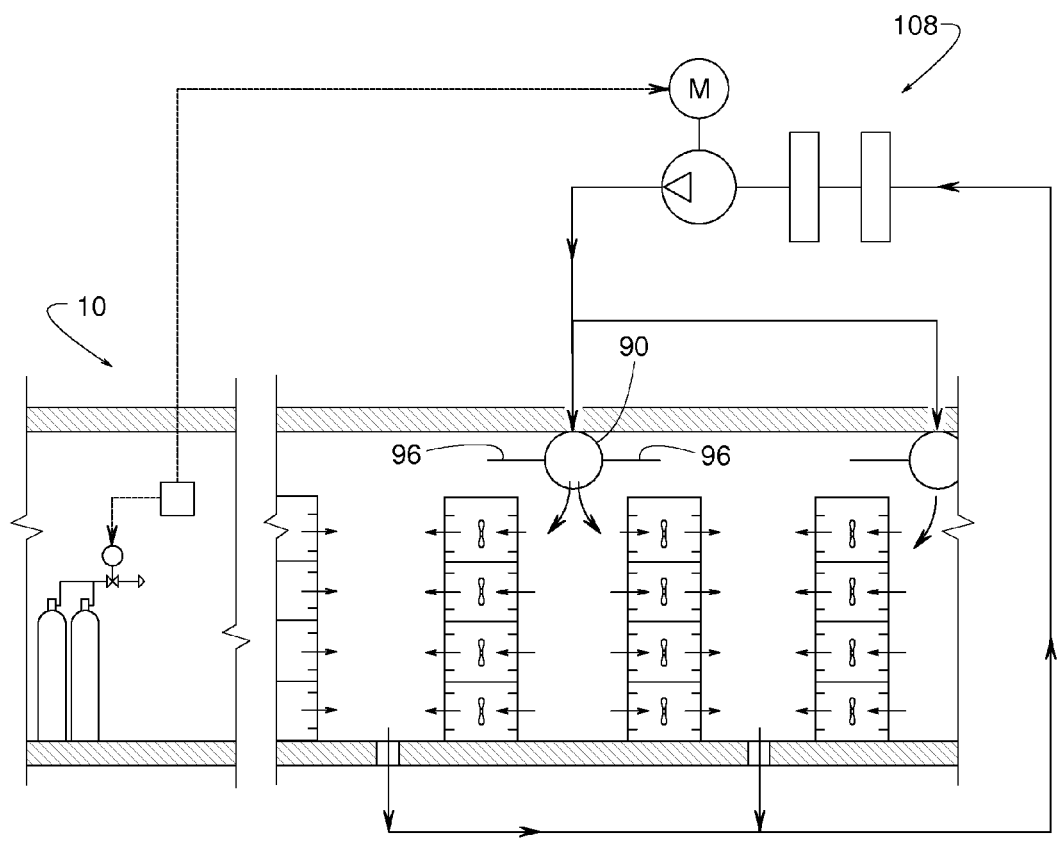
FIG. 11 is a cross-sectional view similar to FIG. 9 but showing another example cooling system constructed in accordance with the teachings disclosed herein.
Figure 12:
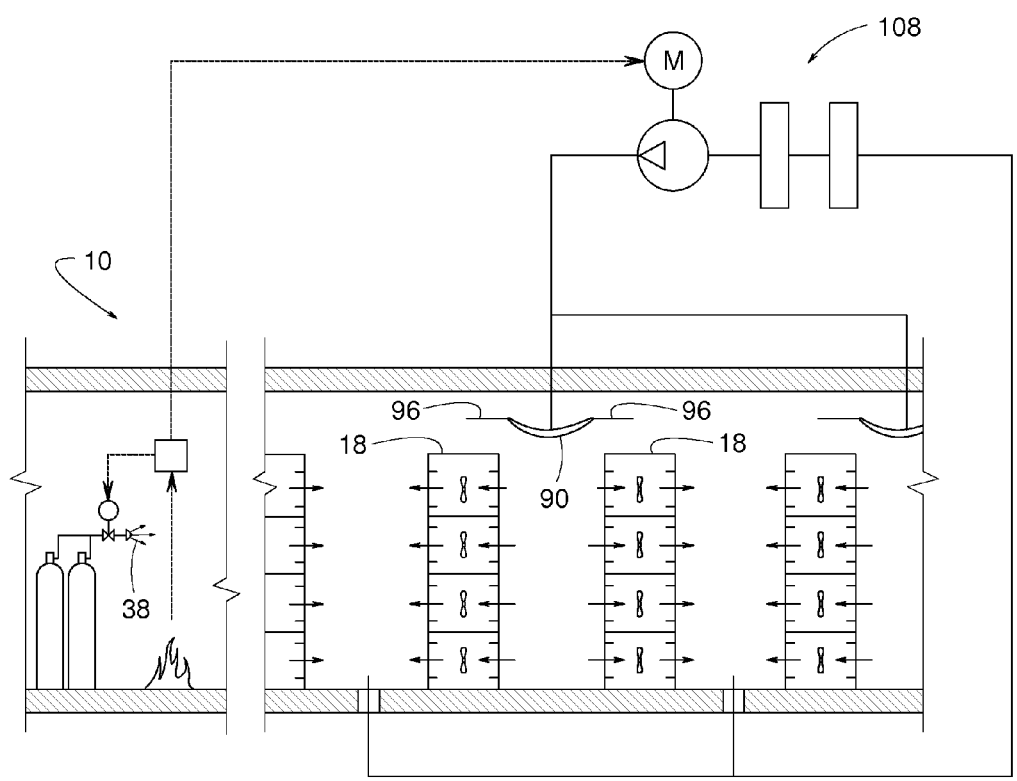
FIG. 12 is a cross-sectional view similar to FIG. 11 but showing the example air ducts in a deflated state as opposed to the inflated state shown in FIG. 11.

FIGS. 11 and 12 show an example cooling system 108 that is similar to the system 88 of FIGS. 9 and 10. With the cooling system 108, however, the supply air duct 90 is elevated to place the wings 96 above and spaced apart from the computer rows 18. The vertical spacing further facilitates the dispersion of the fire extinguishing fluid 38 when needed while reducing the amount of warm air above the supply air duct 90 (e.g., above the wings 96) from being entrained by the cooler air dispersed from the bottom of the supply air duct 90 (e.g., below the wings 96) into the cold aisle. FIG. 11 shows the supply air duct 90 in its inflated state, and FIG. 12 shows the supply air duct 90 in its deflated state. In some examples, the wing 96 extends lengthwise substantially the full length of the rows of computer 18 and is made of a pliable sheet of material. The supply air duct 90 can be supported and the wings 96 can be held taut by any suitable means, such as by a taut cable, a track, struts, and/or combinations thereof.

Figure 15:
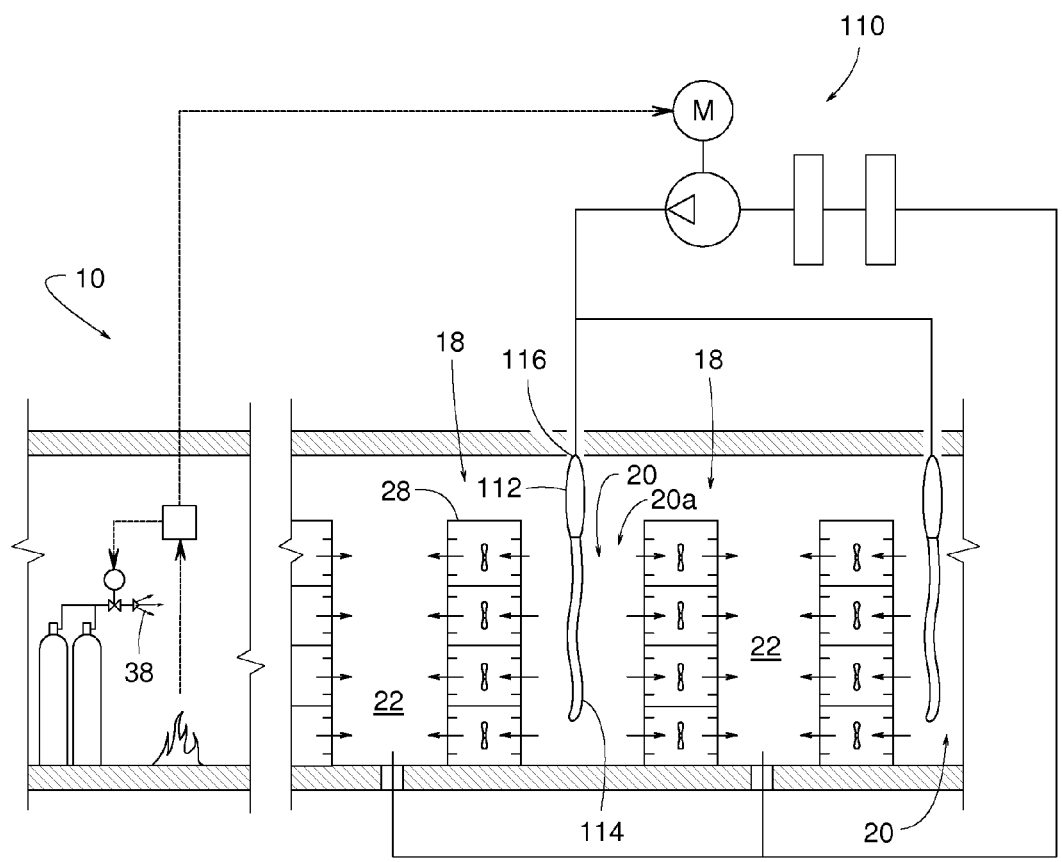
FIG. 15 is a cross-sectional view similar to FIG. 13 but showing the example air ducts in a deflated state as opposed to the inflated state shown in FIG. 13.

FIGS. 13-15 show an example cooling system 110 that provides a more concentrated discharge of cool supply air directly in the cold aisles 20, thereby reducing (e.g., minimizing) the mixing of cool air with warmer air in the hot aisles 22. In the illustrated example, a supply air duct 112 with a plurality of branch air ducts 114 are installed in each cold aisle 20. FIGS. 13 and 14 show at least one of the air ducts in an inflated state, and FIG. 15 shows at least one of them in a deflated state. The supply air duct 112 is elevated with an upper section 116 that is higher than the top surface 28 of the rows of computer 18 to provide head clearance for personnel in the area and to facilitate the dispersion of the fire extinguishing fluid 38 when needed.

To ensure that the branch air ducts 114 inject cool air well into the cold aisle 20, a lowermost distal point 118 of the branch air duct 114 extends lower than the top surface 28 of the computer rows 18, and the distal point 118 lies within a certain row length 120 of the row of computers 18. That is, the distal point 118 is positioned within a length of the cold aisle 20 defined by ends of the row of computers 18. he branch air ducts 114 include an air permeable tubular wall 122 made of a pliable material so that personnel working in the aisle can simply shove branch air ducts aside to gain unobstructed access to the computers 14.

During normal operation, as shown in the illustrated examples of FIGS. 13 and 14, a main current of air 124 flows sequentially from the second aisle 22*a* (the first hot aisle), through the return air register 62, through the return air manifold 64, through the filter 50, through the cooling coil 52, through the blower 66, through the supply air manifold 126, into the supply air duct 112, lengthwise through the supply air duct 112, downward from the supply air duct 112 through the branch air ducts 114, and outward from the branch air ducts 114 into the first aisle 20*a* (the cold aisle). The main current of air 124 in the first aisle 20*a* supplies a first current of air 26*a* through the first row of computers 18*a* and a second current of air 26*b* through the second row of computers 18*b*.

Figure 16:
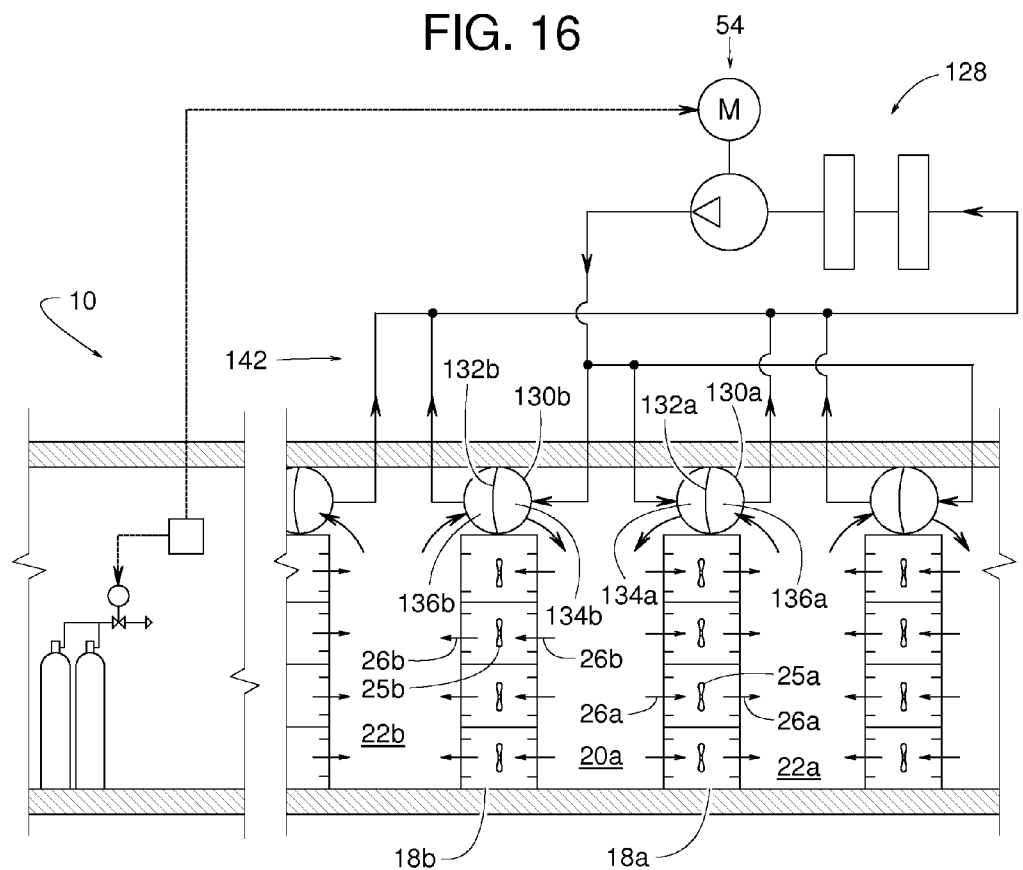
FIG. 16 is a cross-sectional view similar to FIG. 3 but showing another example cooling system constructed in accordance with the teachings disclosed herein.
Figure 17:
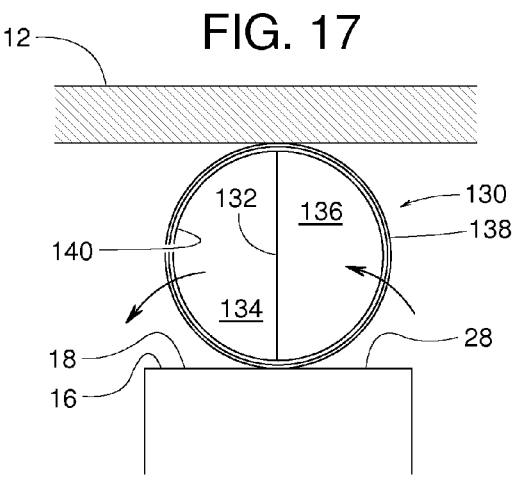
FIG. 17 is a cross-sectional view similar to FIG. 16 but showing just a single example air duct.

FIGS. 16 and 17 show an example cooling system 128 that has an air duct 130 (e.g., air duct 130*a* and 130*b*) atop each row of computers 18, wherein the air duct 130 has a longitudinal internal web 132 (e.g., first web 132*a* in the first air duct 130*a* and second web 132*b* in the second air duct 130*b*) that separates each air duct 130 into a supply chamber 134 (e.g., 134*a* and 134*b*) and a return chamber 136 (e.g., 136*a* and 136*b*). The air duct 130 has a pliable tubular wall 138 that is air permeable to pass air from the hot aisle 22*a* into the return chamber 136 and to release air from the supply chamber 134 to the cold aisle 20*a*. The blower 66 and the internal fans 25 drive the movement of air. To reduce the likelihood of the negative pressure in the return chamber 136 causing the air duct's pliable tubular wall to collapse, the air duct 130 includes some form of framework 140 that holds the air duct 130 in an expanded shape. Examples of the framework 140 include a plurality of rigid hoops, a longitudinal tensioning device, and combinations thereof.

In the illustrated example, the first row of computers 18*a* is between the first aisle 20*a* (the cold aisle) and the second aisle 22*a* (the first hot aisle), and the second row of computers 18*b* is between the first aisle 20*a* (the cold aisle) and the third aisle 22*b* (the second hot aisle). In this example, the cooling system 128 includes the first air duct 130*a* atop the first row of computers 18*a*, the second air duct 130*b* atop the second row of computers 18*b*, the first web 132*a* dividing the first air duct 130*a* into a first return chamber 136*a* and a first supply chamber 134*a*, the second web 132*b* dividing second the air duct 130*b* into a second return chamber 136*b* and a second supply chamber 134*b*, the blower system 54, a first fan 25*a* for urging a first current of air 26*a* through the first row of computers 18*a*, and a second fan 25*b* for urging a second current of air 26*b* through the second row of computers 18*b*.

During normal operation of the example cooling system 128, the blower system 54 draws air from the second aisle 22*a* (the first hot aisle) into the first return chamber 136*a*, the blower system 54 urges air from the first return chamber 136*a* into the first supply chamber 134*a* via a network of air ducts 142, and the blower system 54 urges air from the first supply chamber 134*a* into the first aisle 20*a* (the cold aisle). Similarly, in the illustrated example, the blower system 54 draws air from the third aisle 22*b* (the second hot aisle) into the second return chamber 136*b*, the blower system 54 urges air from the second return chamber 136*b* into the second supply chamber 134*b* via the air ducts 142, and the blower system 54 urges air from the second supply chamber 134*b* into the first aisle 20*a* (the cold aisle).

FIGS. 18 and 19 show an example adjustable or fixed-position nozzle 76 that can be used to direct a main current of air 144 discharged from the nozzle. Further, the example nozzle 76 can also be used for inducing surrounding air currents 146 to flow in the same general direction as the main current of air 144. In some examples, the surrounding air currents 146 are from the air released through the air permeable sidewall of a pliable air duct in the area surrounding the nozzle 76. The nozzle 76 and the principle of inducing and directing surrounding air currents can be applied to any of the air duct examples shown in FIGS. 3-23.

FIGS. 20-23 show example internal baffles 198, 200 that can be used to reduce negative effects that might otherwise result due to the dynamic air pressure of unrestricted air rushing axially through a supply air duct 202, 204. For instance, without the baffles 198, 200, air released through the air permeable sidewall of the ducts 202, 204 might tend to follow the axial longitudinal direction of the air flowing lengthwise through the duct rather than discharging from the duct in an often more desirable radial direction (perpendicular to the duct's length). In the illustrated example, the internal baffles 198, 200 interrupt the axial or longitudinal velocity of the air entering axial at the end 74 of the corresponding supply air ducts 202, 204. The internal baffles 198, 200 may be applied to any of the air duct examples shown in FIGS. 3-23.

In the example shown in FIGS. 20 and 22, the supply air duct 202 includes an air permeable pliable outer wall 206 and the internal baffle 198 that is horizontally elongate. In this example, the internal baffle 198 is tubular (e.g., conical or cylindrical). In the illustrated example, the internal baffle 198 separates an interior space of the supply air duct 202 into an inner upstream chamber 208 and an outer downstream chamber 210. A supply current of air 212 flows sequentially from the second aisle 22*a* (a hot aisle) through a cooling system, lengthwise through the upstream chamber 208, radially outward through the internal baffle 198, through the downstream chamber 210, radially outward through an air permeable pliable outer wall 214 of the supply air duct 202, and downward from the supply air duct 202 into the first aisle 20*a* (a cold aisle). The air may then pass through the row of computers 18*a* and into second aisle 22*a* (the hot aisle). In some examples, the cooling system includes the return register 62, the blower system 54, and suitable ductwork to return the air back to the upstream chamber 208 at the axial end 74 of the supply air duct 202 to repeat the circuit.

In the example shown in FIGS. 21 and 23, the supply air duct 204 includes an air permeable pliable outer wall 216 and the internal baffle 200 that is horizontally elongate. In this example, the internal baffle 200 is generally planar. In the illustrated examples, the internal baffle 200 separates an interior space of supply air duct 204 into an inner upstream chamber 218 and an outer downstream chamber 220. A supply current of air 212 flows sequentially from the second aisle 22*a* (a hot aisle) through a cooling system, lengthwise through the upstream chamber 218, radially outward through the internal baffle 200, through the downstream chamber 220, radially outward through an air permeable pliable outer wall 222 of the supply air duct 204, and downward from the supply air duct 204 into the first aisle 20*a* (cold aisle). The air may then pass through the row of computers 18*a* and into second aisle 22*a* (the hot aisle). In some examples, the cooling system includes the return register 62, the blower system 54, and suitable ductwork to return the air back to the upstream chamber 218 at the axial end 74 to repeat the circuit.

Although certain example methods, apparatus and articles of manufacture have been described herein, the scope of the coverage of this patent is not limited thereto. On the contrary, this patent covers all methods, apparatus and articles of manufacture fairly falling within the scope of the appended claims either literally or under the doctrine of equivalents.

What is claimed is:

1. A cooling system for a datacenter, wherein the datacenter includes a plurality of computers arranged in a row within a building, the row of computers disposed between a cold aisle and a hot aisle, the row of computers defining an air passageway between the cold aisle and the hot aisle, the row of computers associated with a top surface that is below and spaced apart from an overhead surface of the building to define a gap between the top surface associated with the row of computers and the overhead surface of the building, the cooling system comprising:

an inflatable air duct to be disposed within the gap, the inflatable air duct having selectively an inflated state and a deflated state, the inflatable air duct filling more of the gap when the inflatable air duct is in the inflated state than when the inflatable air duct is in the deflated state, wherein the inflatable air duct is to rest upon the top surface associated with the row of computers such that a weight of the inflatable air duct is supported by the top surface.

2. The cooling system of claim 1, wherein the inflatable air duct includes an upper section facing toward the overhead surface when the inflatable air duct is in the inflated state, and the upper section is closer to the top surface associated with the row of computers when the inflatable air duct is in the deflated state than when the inflatable air duct is in the inflated state.

3. The cooling system of claim 1, further including a sensor to be disposed within the building and being responsive to at least one of a fire, a temperature limit, or a presence of smoke, the inflatable air duct changing from the inflated state to the deflated state in response to the sensor detecting the at least one of the fire, the temperature limit, or the presence of smoke.

4. The cooling system of claim 1, wherein the cooling system is to cause a current of air to flow sequentially from the hot aisle, lengthwise through the inflatable air duct, and downward from the inflatable air duct into the cold aisle.

5. The cooling system of claim 1, wherein the inflatable air duct includes an air permeable pliable wall and a nozzle attached to the air permeable pliable wall, the nozzle providing a discharge air path from an interior of the inflatable air duct toward the cold aisle, the nozzle to guide a discharge current of air through the discharge air path, the discharge current of air to direct a secondary current of air discharging outwardly through the air permeable pliable wall.

6. The cooling system of claim 1, wherein the inflatable air duct includes an air permeable pliable outer wall and an internal baffle that is elongate along a length of the inflatable air duct, the internal baffle separating an interior space of the inflatable air duct into an upstream chamber and a downstream chamber, the cooling system to cause a current of air to flow sequentially from the hot aisle, lengthwise through the upstream chamber, through the internal baffle, through the downstream chamber, through the air permeable pliable outer wall, and downward from the inflatable air duct into the cold aisle.

7. The cooling system of claim 1, wherein the inflatable air duct spans the entire gap between the top surface and the overhead surface when in the inflated state.

8. The cooling system of claim 1, further including an internal restraint to couple a first sidewall of the inflatable air duct to a second sidewall of the inflatable air duct, the first sidewall to face toward the hot aisle and the second sidewall to face toward the cold aisle, the internal restraint to limit outward movement of the first and second sidewalls when the inflatable air duct is in the deflated state.

9. The cooling system of claim 1, wherein the inflatable air duct is secured to the top surface associated with the row of computers.

10. A cooling system comprising:
an inflatable air duct to be disposed within a gap between an overhead surface of a building and a top surface associated with a row of devices interposed between a first aisle of the building and a second aisle of the building, the first and second aisles to be in fluid communication across the gap, the devices emitting heat to a surrounding area during operation, the row of devices defining an air passageway below the gap to place the first aisle in fluid communication with the second aisle, the inflatable air duct having selectively an inflated state and a deflated state, the inflatable air duct substantially blocks dispersion of gas within the building across the gap between the first and second aisles when the inflatable air duct is in the inflated state and enables dispersion of gas across the gap when the inflatable air duct is in the deflated state; and a blower to be connected in fluid communication with the inflatable air duct, the blower to force a current of air sequentially from the second aisle, lengthwise through the inflatable air duct, and downward from the inflatable air duct into the first aisle.

11. The cooling system of claim 10, wherein the inflatable air duct includes an upper section facing toward the overhead surface when the inflatable air duct is in the inflated state, and the upper section is closer to the top surface associated with the row of devices when the inflatable air duct is in the deflated state than when the inflatable air duct is in the inflated state.

12. The cooling system of claim 10, wherein the inflatable air duct is to change from the inflated state to the deflated state in response to a sensor detecting at least one of a fire, a temperature limit, or a presence of smoke.

13. The cooling system of claim 10, wherein the inflatable air duct includes an air permeable pliable wall and a nozzle attached to the air permeable pliable wall, the nozzle providing a discharge air path from an interior of the inflatable air duct toward the first aisle, the nozzle to guide a discharge current of air through the discharge air path, the discharge current of air to direct a secondary current of air discharging outwardly through the air permeable pliable wall.

14. The cooling system of claim 10, wherein the inflatable air duct includes an air permeable pliable outer wall and an internal baffle that is horizontally elongate, the internal baffle separating an interior space of the inflatable air duct into an upstream chamber and a downstream chamber, the cooling system to cause the current of air to flow sequentially from the second aisle, lengthwise through the upstream chamber, through the internal baffle, through the downstream chamber, through the air permeable pliable outer wall, and downward from the inflatable air duct into the first aisle.

15. The cooling system of claim 10, wherein the first aisle is cooler than the second aisle.

16. The cooling system of claim 10, wherein the inflatable air duct is to be in contact with both the overhead surface of the building and the top surface associated with the row of devices when in the inflated state.

17. The cooling system of claim 10, wherein a weight of the inflatable air duct is supported by the top surface associated with the row of devices.

18. A cooling system comprising:
an inflatable air duct to be disposed within a gap between an overhead surface of a building and a top surface associated with a row of devices interposed between a first aisle of the building and a second aisle of the building, the devices emitting heat to a surrounding area during operation, the row of devices defining an air passageway below the gap to place the first aisle in fluid communication with the second aisle, the inflatable air duct having selectively an inflated state and a deflated state, the inflatable air duct blocking more of the gap when the inflatable air duct is in the inflated state than when the inflatable air duct is in the deflated state;

a blower to be connected in fluid communication with the inflatable air duct, the blower to force a current of air sequentially from the second aisle, lengthwise through the inflatable air duct, and downward from the inflatable air duct into the first aisle; and an internal restraint to couple a first sidewall of the inflatable air duct to a second sidewall of the inflatable air duct, the first sidewall to face toward the first aisle and the second sidewall to face toward the second aisle.

19. A cooling system comprising:

an inflatable air duct to rest upon a top surface associated with a row of devices interposed between a first aisle in a room of a building and a second aisle in the room of the building, the devices emitting heat to a surrounding area during operation, the top surface associated with the row of devices being below and spaced apart from an overhead surface of the room to define a gap therebetween, the inflatable air duct to substantially fill the gap between the top surface and the overhead surface when the inflatable air duct is in an inflated state and to substantially unblock the gap when the inflatable air duct is in a deflated state.

* * * * *